(12) United States Patent
Zhu et al.

(10) Patent No.: US 8,576,617 B2
(45) Date of Patent: Nov. 5, 2013

(54) CIRCUIT AND METHOD FOR GENERATING A REFERENCE LEVEL FOR A MAGNETIC RANDOM ACCESS MEMORY ELEMENT

(75) Inventors: Xiaochun Zhu, San Diego, CA (US); Xia Li, San Diego, CA (US); Wenqing Wu, San Diego, CA (US); Jung Pill Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 57 days.

(21) Appl. No.: 13/293,565

(22) Filed: Nov. 10, 2011

(65) Prior Publication Data

US 2013/0121066 A1    May 16, 2013

(51) Int. Cl.
*G11C 11/00* (2006.01)
*G11C 11/14* (2006.01)

(52) U.S. Cl.
USPC .................. 365/158; 365/171; 365/210.14

(58) Field of Classification Search
USPC ........................................ 365/158
See application file for complete search history.

(56) References Cited

U.S. PATENT DOCUMENTS

| | | | | |
|---|---|---|---|---|
| 6,392,923 | B1* | 5/2002 | Naji | 365/158 |
| 6,697,294 | B1* | 2/2004 | Qi et al. | 365/210.15 |
| 6,791,887 | B2* | 9/2004 | Hung et al. | 365/189.09 |
| 6,856,537 | B2* | 2/2005 | Tanizaki et al. | 365/158 |
| 7,321,507 | B2* | 1/2008 | Yang et al. | 365/158 |
| 7,800,941 | B2 | 9/2010 | Kim et al. | |
| 7,952,916 | B2* | 5/2011 | Maeda et al. | 365/158 |
| 8,154,903 | B2* | 4/2012 | Jung et al. | 365/148 |
| 8,320,166 | B2* | 11/2012 | Park et al. | 365/158 |
| 8,363,457 | B2* | 1/2013 | Keshtbod | 365/158 |
| 8,369,129 | B2* | 2/2013 | Fujita et al. | 365/148 |
| 2010/0128519 | A1 | 5/2010 | Li et al. | |
| 2010/0302838 | A1 | 12/2010 | Wang et al. | |
| 2011/0006385 | A1 | 1/2011 | Zheng et al. | |
| 2011/0075471 | A1 | 3/2011 | Zhu et al. | |

* cited by examiner

*Primary Examiner* — Son Mai
(74) *Attorney, Agent, or Firm* — Sam Talpalatsky; Nicholas J. Pauley; Joseph Agusta

(57) ABSTRACT

A method of establishing a reference level includes providing first and second non-overlapping paths from a first node to a second node, providing first and second reference magnetic random access memory (MRAM) elements in the first path, providing third and fourth reference MRAM elements in the second path, measuring a first value indicative of a resistance between the first node and the second node, and setting the reference level based at least in part on the measured value. Also an associated reference circuit.

41 Claims, 11 Drawing Sheets

CIRCUIT AND METHOD FOR GENERATING A REFERENCE LEVEL FOR A MAGNETIC RANDOM ACCESS MEMORY ELEMENT

FIELD OF DISCLOSURE

The present application for patent is directed to a circuit for generating a reference level that can be used to determine the state of a magnetic random access memory (MRAM) element and to a method of generating the reference level, and, more specifically, to a circuit for generating a reference level against which a measured resistance of a target MRAM can be compared which reference level is spaced from a distribution of the measured values being compared to the reference level and to a method of generating the reference level.

BACKGROUND

Magnetic tunnel junctions (MTJ's), including spin torque transfer (STT) MTJ's, comprise two layers of magnetic material separated by a thin insulator. The magnetization direction of one magnetic layer is fixed and the magnetization direction of the other magnetic layer can be changed by applying a voltage or current to the MTJ. When the magnetization directions of the fixed, and the free layers are opposite or antiparallel, the MTJ has a higher resistance than when the magnetization directions of the fixed and free layers are parallel. The resistance of an MTJ can be measured by applying a small read current thereto. The MTJ can represent a digital "0" in one of these magnetic states and to represent a digital "1" in the other thus allowing the MTJ to be used as a memory element, a magnetic random access memory element (MRAM).

After the resistance of a target MTJ is measured, it must be compared to a reference resistance to determine whether the measured resistance represents a parallel- or antiparallel-state MTJ. Conventionally, a reference resistance is determined by passing a reference current through a parallel-state reference MTJ and by passing the reference current through an antiparallel-state reference MTJ. FIG. 1 illustrates a conventional reference circuit. In FIG. 1, a plurality of parallel-state MTJ's 102 are connected between a first input line 104 and a first output line 106, and a current IRp passing through individual ones of these parallel-state MTJ's 102 is measured. Similarly, a plurality of anti-parallel state MTJ's 108 are connected between a second input line 110 and a second output line 112, and a current IRap passing through individual ones of the antiparallel MTJ's 108 is measured. These two currents IRp and IRap are added, and the sum is divided by two to determine the average current flow through MTJ's in these two states. A reference resistance is calculated from this reference current and an applied voltage.

Due in part to manufacturing differences, the resistances of different MTJ's may vary. FIG. 2 shows a first distribution 202 of resistances of a given group of MTJ's when they are in a magnetically parallel state and a second distribution 204 of this group of MTJ's when they are in a magnetically antiparallel state. The first distribution 202 extends from approximately 2000 ohms to 3500 ohms while the second distribution 204 extends from approximately 4250 ohms to 7250 ohms When a reference resistance is determined from such MTJ's in a conventional manner, that resistance may have a third distribution 206 from about 3000 ohms to 4250 ohms This third distribution 206 thus overlaps with at least the first distribution 202 and has little or no spacing from the second distribution 204. This lack of a clear separation between the resistance distributions may make it difficult to determine with confidence the magnetic state of a target MTJ. It would therefore be desirable to determine a reference resistance in a manner that produces a narrow distribution that is spaced from the distributions of measured resistances of MTJ elements in a parallel or antiparallel state.

SUMMARY

An exemplary embodiment comprises a method of establishing a reference level that includes providing first and second non-overlapping paths from a first node to a second node. First and second reference magnetic random access memory (MRAM) elements are provided in the first path, and third and fourth reference MRAM elements are provided in the second path. Both of the first and second MRAM elements are in a parallel state or both of the first and second MRAM elements are in an antiparallel state. The method includes measuring a first value indicative of a resistance between the first node and the second node, and setting the reference level based at least in part on the measured value.

Another embodiment comprises a method of establishing a reference level that includes providing at least first and second non-overlapping paths, providing at least first and second reference MRAM elements in the first path, and providing at least third and fourth reference MRAM elements in the second path. The method also includes measuring a first value indicative of a resistance of the first path, measuring a second value indicative of a resistance of the second path, and setting the reference level based at least in part on the first and second measured values.

A further embodiment comprises a reference circuit for generating a reference level that includes first and second non-overlapping paths from a first node to a second node, first and second reference MRAM elements in the first path, both in a parallel state or both in an antiparallel state, and third and fourth reference MRAM elements in the second path. The reference circuit also includes a measurement circuit that receives a first value indicative of a resistance between the first node and the second node and outputs the reference level based at least in part on the first value.

Another embodiment comprises a reference circuit for generating a reference level that includes at least first and second non-overlapping paths, at least first and second reference magnetic random access memory (MRAM) elements in the first path, and at least third and fourth reference MRAM elements in the second path. The reference circuit also includes a controller for measuring a first value indicative of a resistance of the first path and for measuring a second value indicative of a resistance of the second path and for setting the reference level based at least in part on the first and second measured values.

Yet another embodiment includes a reference circuit for generating a reference level including first and second path arrangements for connecting a first node and a second node, first and second reference MRAM elements in the first path arrangement, both of the first and second MRAM elements being in a parallel state or both being in an antiparallel state, third and fourth reference MRAM elements in the second path arrangement, and a determining arrangements for receiving a first value indicative of a resistance between the first node and the second node and outputting the reference level based at least in part on the first value.

A reference circuit for generating a reference level that includes at least first and second non-overlapping path arrangements, at least first and second reference magnetic random access memory (MRAM) elements in the first path arrangement, at least third and fourth reference MRAM elements in the second path arrangement, a control arrangement for measuring a first value indicative of a resistance of the first path arrangement and for measuring a second value indicative of a resistance of the second path arrangement and for setting the reference level based at least in part on the first and second measured values.

A further embodiment includes a method of establishing a reference level that includes steps for providing first and second non-overlapping paths from a first node to a second node, steps for providing first and second reference magnetic random access memory (MRAM) elements in the first path, both of the first and second MRAM elements being in a parallel magnetic state or both being in an antiparallel magnetic state, steps for providing third and fourth reference MRAM elements in the second path, steps for measuring a first value indicative of a resistance between the first node and the second node, and steps for setting the reference level based at least in part on the measured value.

Another embodiment comprises a method of establishing a reference level that includes steps for providing at least first and second non-overlapping paths, steps for providing at least first and second reference magnetic random access memory (MRAM) elements in the first path, steps for providing at least third and fourth reference MRAM elements in the second path, steps for measuring a first value indicative of a resistance of the first path, steps for measuring a second value indicative of a resistance of the second path, and steps for setting the reference level based at least in part on the first and second measured values.

Yet another embodiment comprises a reference circuit for generating a reference level. The reference circuit includes first and second non-overlapping paths from a first node to a second node, first and second reference MRAM elements in the first path and third and fourth reference MRAM elements in the second path. A first path intermediate node is located between the first reference MRAM element in the first path and the second reference MRAM element in the first path and is electrically connected to a second path intermediate node located between the third reference MRAM element in the second path and the fourth reference MRAM element in the second path. The reference circuit also includes a measurement circuit receiving a first value indicative of a resistance between the first node and the second node and outputting the reference level based at least in part on the first value.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
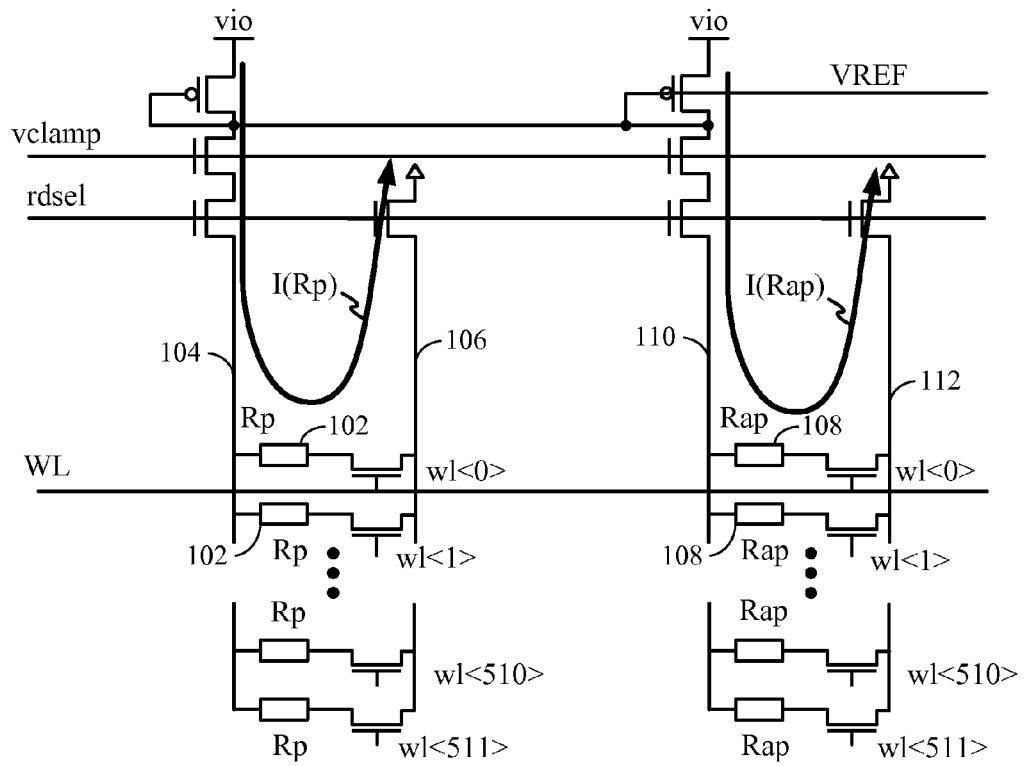
FIG. 1 is a circuit diagram schematically showing a conventional reference circuit.
Figure 2:
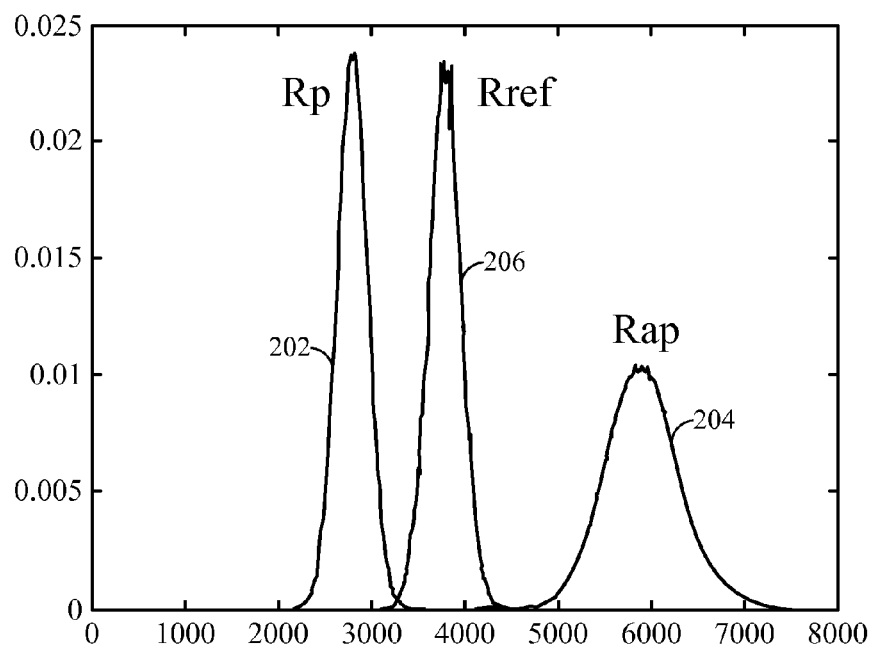
FIG. 2 is a graph showing a relation between a distribution of measured resistances of MTJ's in parallel and antiparallel states and a distribution of a conventionally calculated reference resistance.
Figure 3:
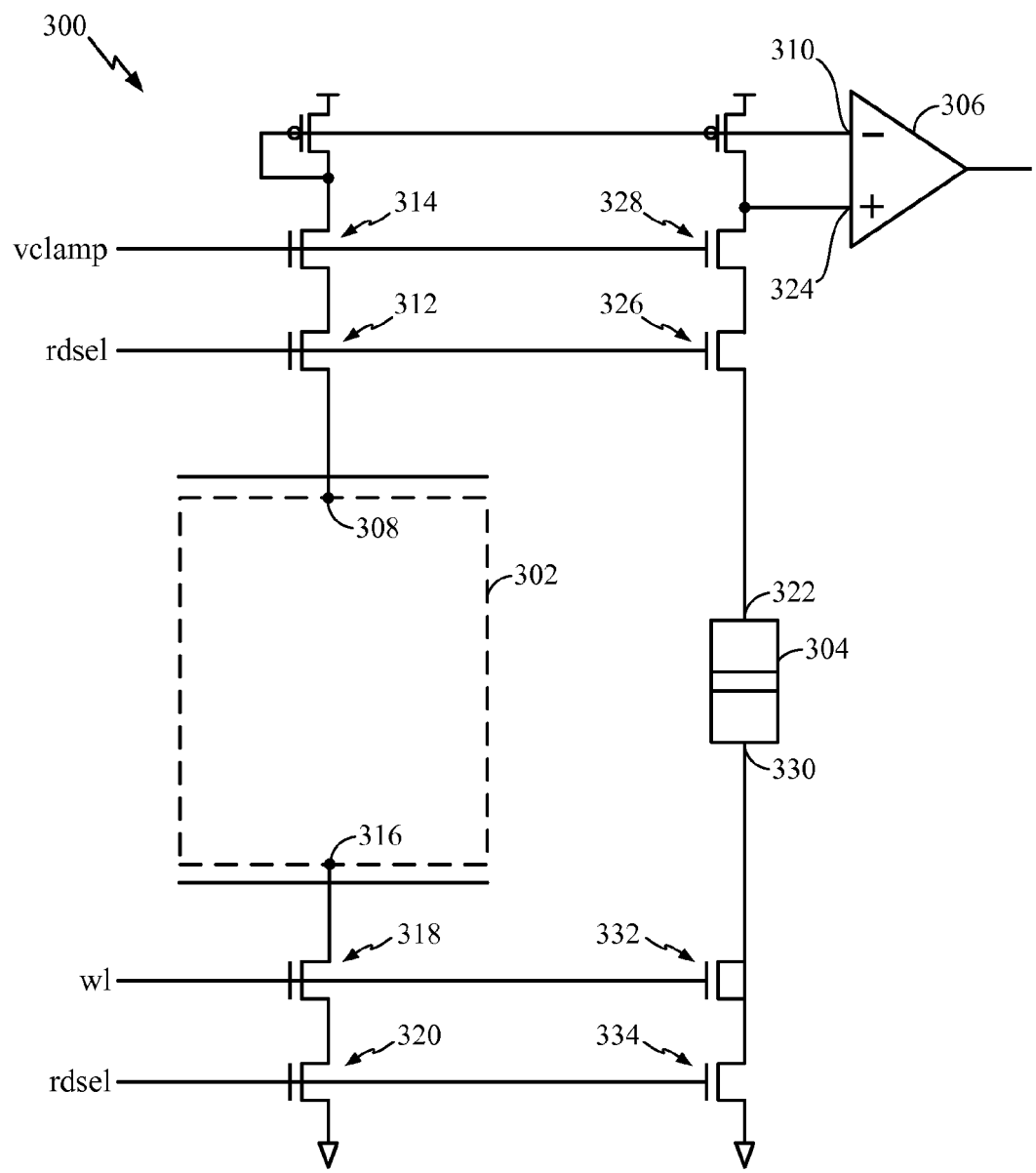
FIG. 3 is a circuit diagram showing a reference cell and a target MTJ connected to a comparator.

Referring now to FIG. 3, a circuit 300 includes a reference cell 302 for generating a reference resistance and also includes a target MTJ 304. The state of the target MTJ 304 is determined by comparing the measured resistance of the target MTJ 304 to the resistance of the reference cell 302 using a comparator 306. The reference cell 302 includes a first node 308 connected to the inverting input 310 of the comparator 306 via a first read select transistor 312 and a first voltage clamping transistor 314 and a second node 316 connected to ground via a first word line transistor 318 and a second read select transistor 320. A first node 322 of the target MTJ 304 is connected to the non-inverting input 324 of the comparator 306 via a third read select transistor 326 and a second voltage clamping transistor 328, and a second node 330 of the target MTJ 304 is connected to ground via a second word line transistor 332 and a fourth read select transistor 334. When the resistance of the target MTJ 304 is determined by the comparator 306 to be greater than the resistance of the reference cell 302, a determination is made that the target MTJ 304 is in an antiparallel state; when the resistance of the target MTJ 304 is less than that of the reference cell 302, a determination is made that the target MTJ 304 is in a parallel state. Various internal configurations of the reference cell 302 are described below.

Figure 4:
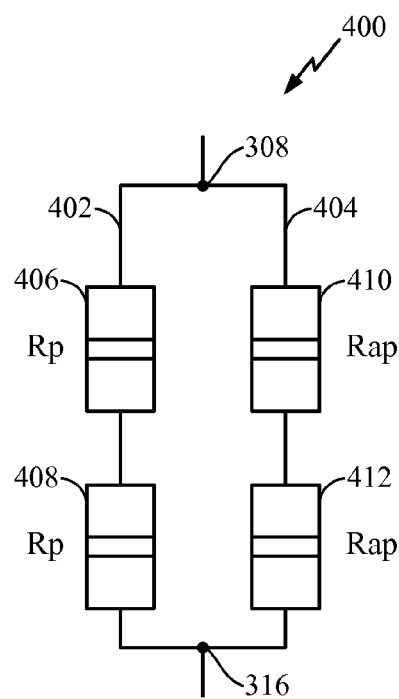
FIG. 4 is a schematic diagram of a circuit for generating a reference resistance according to an embodiment.

FIG. 4 illustrates an embodiment of a reference cell 400 that includes a reference cell first node 308 and a reference cell second node 316 which are electrically connected to reference cell first node 308 and reference cell second node 316 of FIG. 3, respectively. The reference cell first node 308 is connected to the reference cell second node 316 by a first path 402 and a second path 404 which first and second paths do not overlap and which constitute first and second electrically parallel paths between the first node 308 and the second node 316. The first path 402 includes a first MTJ element 406 and a second MTJ element 408, both of which are in a magnetically parallel state, and the second path 404 includes a third MTJ element 410 and a fourth MTJ element 412, both of which are in a magnetically antiparallel state. The resistance between the first node 308 and the second node 316 is input to the inverting input 310 of the comparator 306 and compared to the resistance of the target MTJ 304 to determine whether the target MTJ 304 is in a parallel or antiparallel state.

Figure 5:
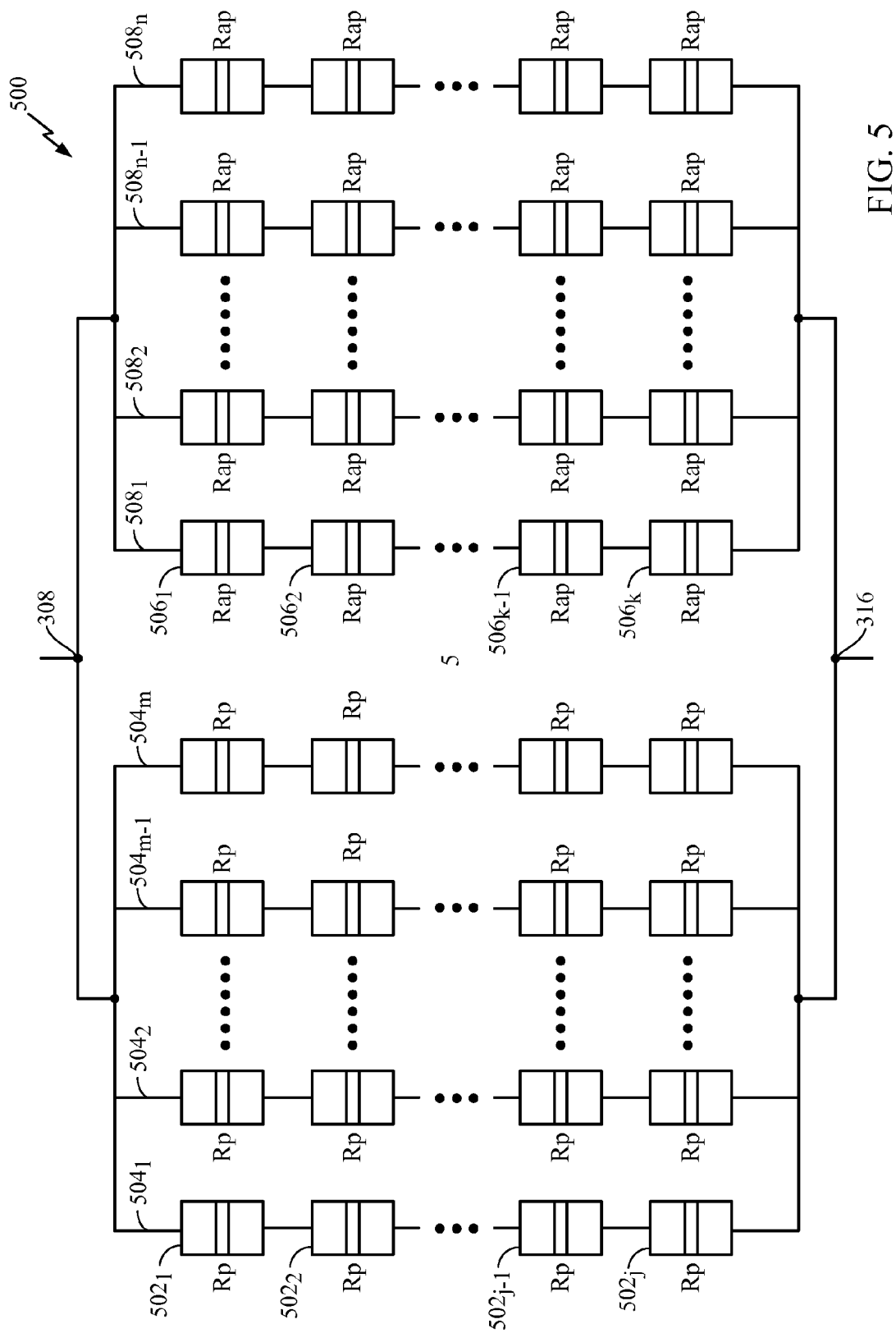

The number of MTJ elements in a given path and the number of paths are not limited to two. In fact, larger numbers of MTJ elements and/or paths will generally produce a narrower range of reference values. FIG. 5 shows a reference cell 500 having j parallel-state MTJ elements 502 (labeled $502_1$ through $502j$) arranged in m columns $504_1$ through $504m$ and a plurality of k antiparallel-state MTJ elements 506 (labeled $506_1$ through $506k$) arranged in n columns $508_1$ through $508n$. The value of k may be, but is not necessarily, equal to m. The m columns 504 and the n columns 508 are connected in parallel between the first node 308 and the second node 316. The resistance between the first node 308 and the second node 316 is input to the comparator 306 for comparison with the measured resistance of the target MTJ 304.

Figure 6:
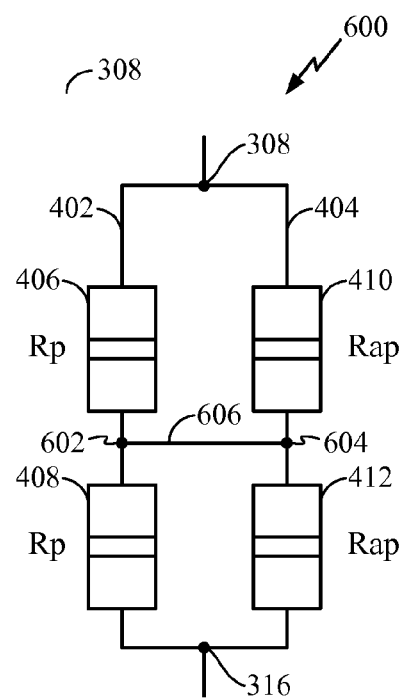
FIGS. 5-9 are circuit diagrams showing circuits for generating a reference resistance according to other embodiments.

FIG. 6 illustrates a reference cell 600 generally similar to the reference cell 400 of FIG. 4 and in which elements common to both embodiments are identified with the same reference numerals. In addition to the elements of the reference cell 400, the reference cell 600 includes a first intermediate node 602 in the first path 402 between the first MTJ element 406 and the second MTJ element 408 and a second intermediate node 604 in the second path 404 between the third MTJ element 410 and the fourth MTJ element 412. The first and second intermediate nodes 602, 604 are connected by electrical connections 606. In this embodiment, the first path 402 and the second path 404 are no longer electrically parallel, and the presence of the electrical connection 606 may provide benefits in some cases.

Figure 7:
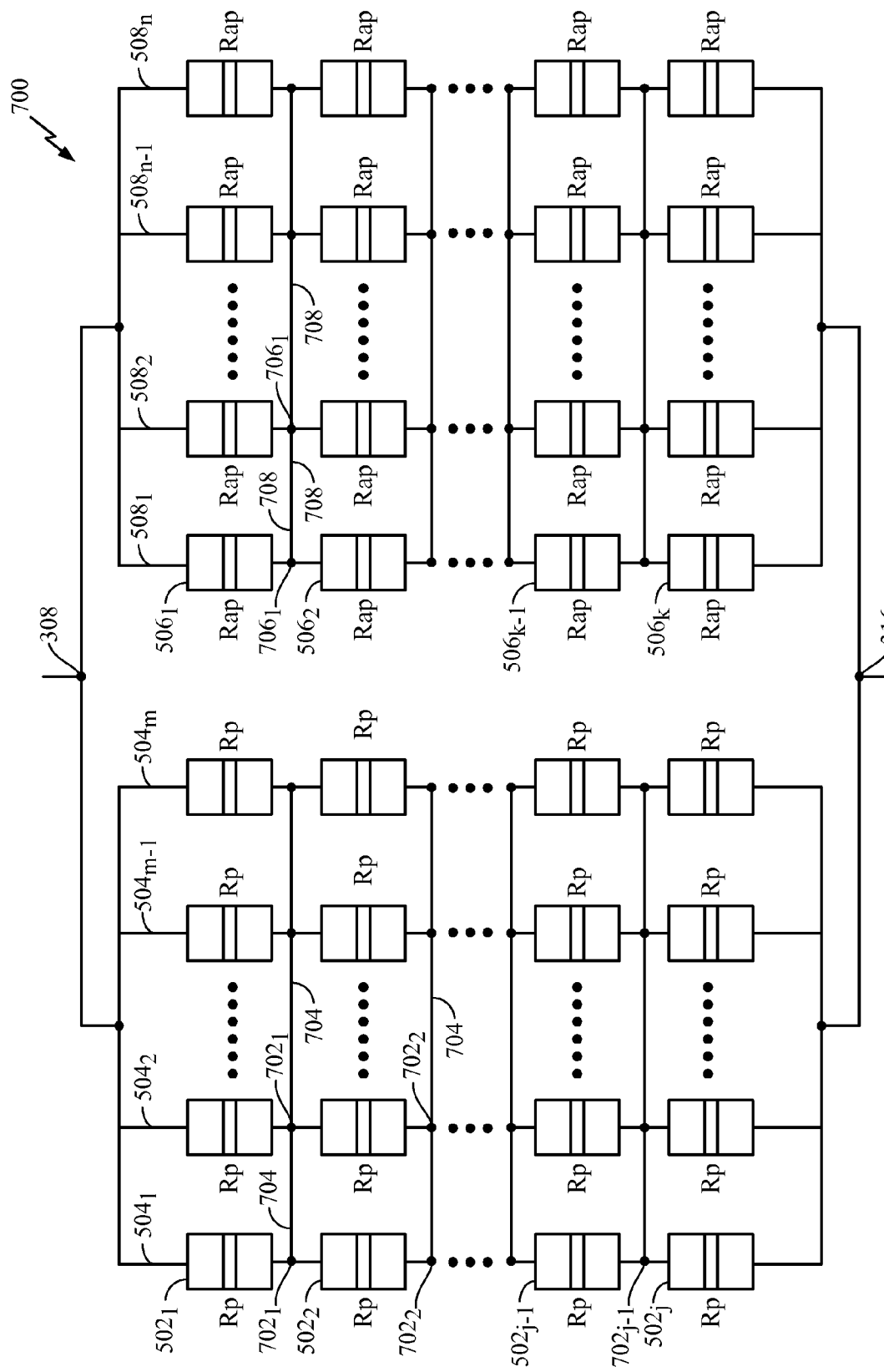

Reference cells having intermediate nodes connected by electrical connections as shown in FIG. 6 can also be formed to have more than two paths and more than two MTJ elements in each path. FIG. 7 shows a reference cell 700 similar to the reference cell 500 of FIG. 5 but which, in addition to the elements of the reference cell 500, includes j-1 intermediate nodes 702 between adjacent pairs of the parallel-state MTJ elements 502 in the columns 504 that are connected to the intermediate nodes 702 on the adjacent paths by electrical connections 704. In a similar manner, j-1 intermediate nodes 706 are provided in the paths 508 between the antiparallel-state MTJ elements 506 and are connected to the intermediate nodes 706 on the adjacent paths 508 by electrical connections 708.

Figure 8:
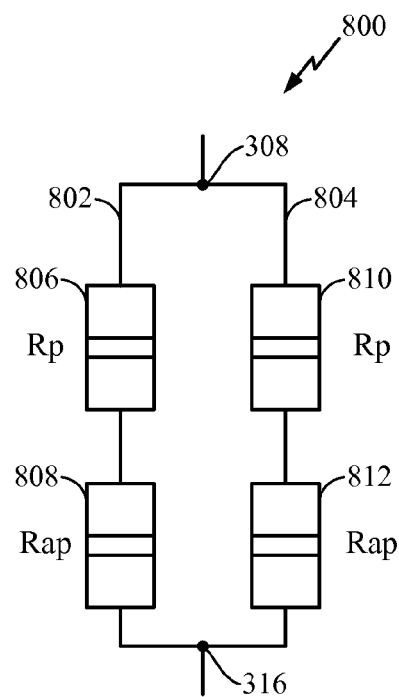

FIG. 8 illustrates another reference cell 800 that includes a first path 802 and a second path 804 between the first node 308 and the second node 316 which first and second paths do not overlap and are electrically parallel. The first path 802 includes a first, parallel-state, MTJ element 806 and a second, anti-parallel state, MTJ element 808, and the second path 804 includes a third, parallel-state, MTJ element 810 and a fourth, antiparallel-state, MTJ element 812. This reference cell 800 is suitable for use in a network of multiple reference cells as described below in connection with FIGS. 10 and 11.

Figure 9:
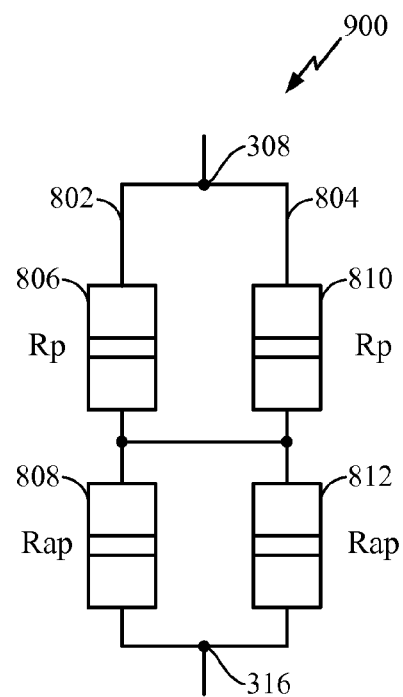

FIG. 9 illustrates a reference cell 900 which is generally similar to the reference cell 800 and which can be connected between the first node 308 and the second node 316 in FIG. 3. In addition to the elements of the reference cell 800, includes a first intermediate node 902 in the first path 802 between the first MTJ element 806 and the second MTJ element 808 and a second intermediate node 904 in the second path 804 between the third MTJ element 810 and the fourth MTJ element 812. An electrical connection 906 connects the first intermediate node 902 and the second intermediate node 904. The presence of the electrical connection 906 may be beneficial in some cases. This reference cell 900 is also suitable for use in a network of multiple reference cells as described below in connection with FIGS. 10 and 11.

Figure 10:
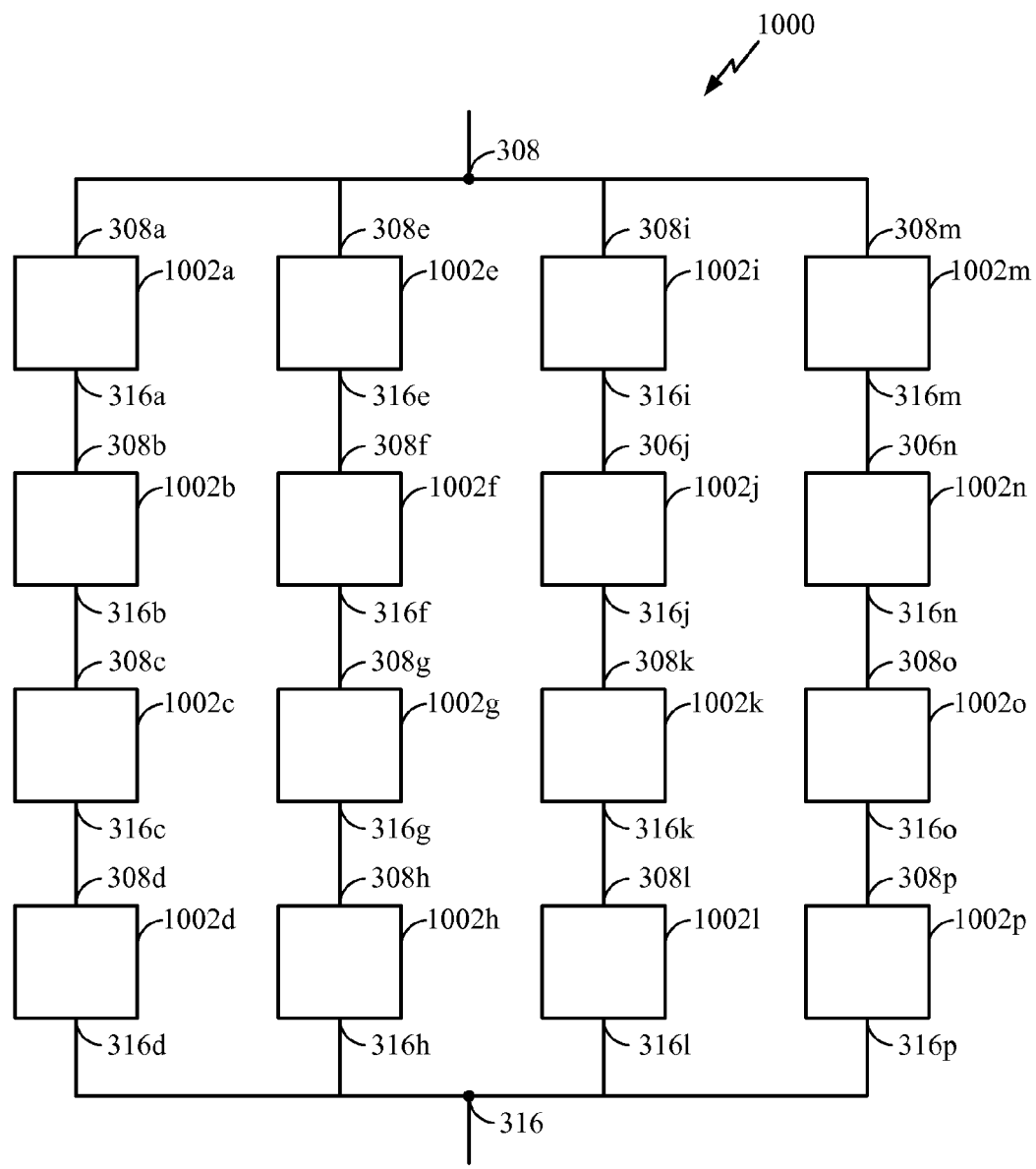
FIG. 10 is a schematic circuit diagram showing a first arrangement of the reference cells of FIGS. 4-9 to form another reference cell according to another embodiment.

FIG. 10 illustrates a reference cell 1000 that includes a plurality of cell blocks 1002 arranged in an array. FIG. 10 includes 16 cell blocks 1002a-1002p; however, a greater or lesser number of the cell blocks 1002 may be provided between the first node 308 and the second node 316. Each of the cell blocks 1002a-1002p includes a cell block first node 308, labeled 308a-308p, and a cell block second node 316, labeled 316a-316p. Each of the cell blocks 1002 in turn comprises the reference cell 400 of FIG. 4 or the reference cell 500 of FIG. 5 or the reference cell 600 of FIG. 6 or the reference cell 700 of FIG. 7 or the reference cell 800 of FIG. 8 or the reference cell 900 of FIG. 9. All the cell blocks 1002 in a given embodiment may include the same reference cell, the reference cell 400, for example, or alternately, the cell blocks 1002 may include various combinations of the reference cells 400, 500, 600, 700, 800, and 900.

Figure 11:
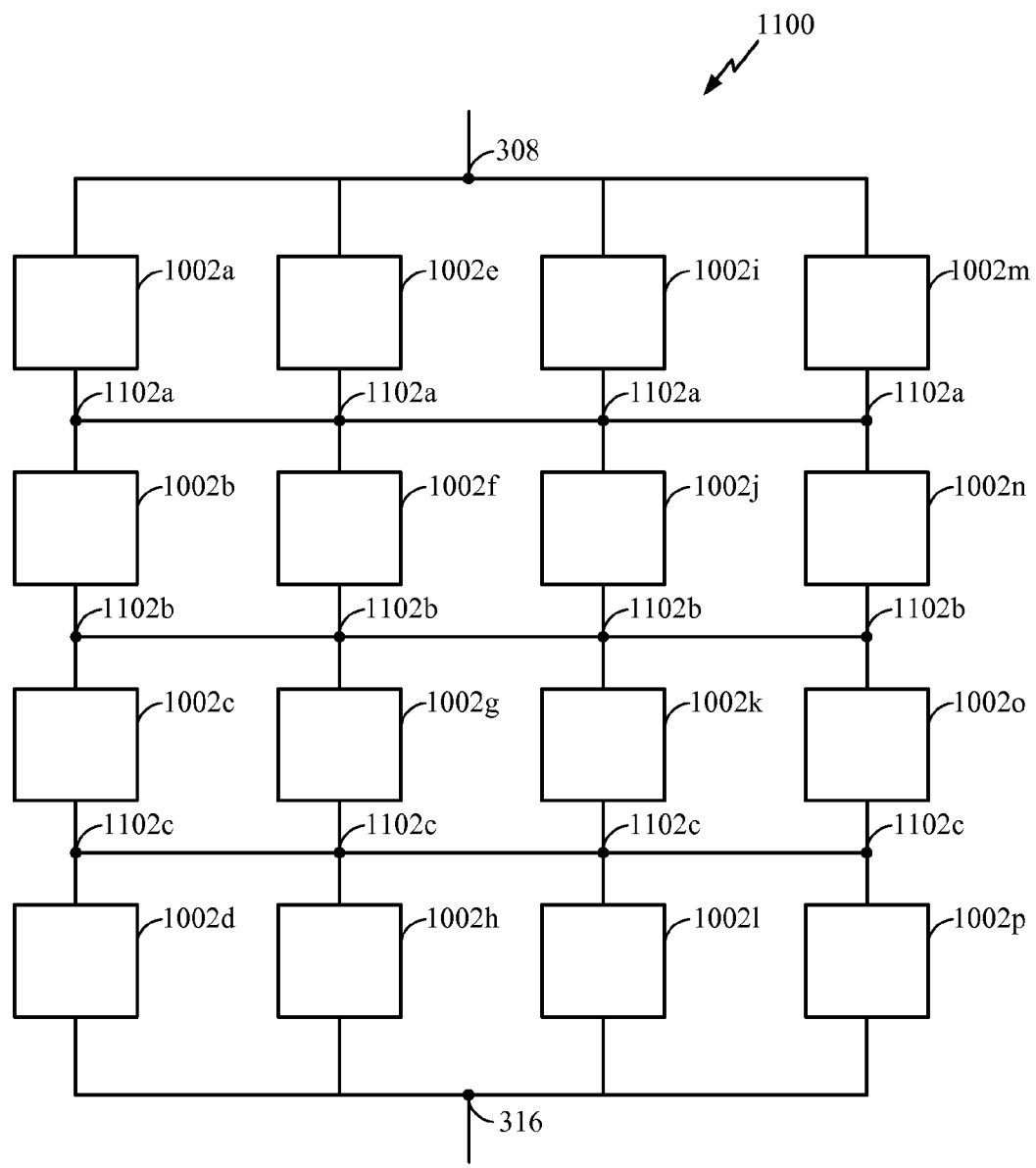
FIG. 11 is a schematic circuit diagram showing another arrangement of the reference cells of FIGS. 4-9 to form a further reference cell according to another embodiment.

FIG. 11 illustrates a reference cell 1100 that is generally similar to the reference cell 1000 of FIG. 10 but which, in addition, includes intermediate nodes 1102a-1102c between adjacent pairs of the cell blocks 1002 and electrical connections 1104 connecting adjacent pairs of these intermediate nodes 1102.

It is possible to establish a given effective resistance value for a given reference cell by appropriately selecting the number of paths and the number of parallel and/or antiparallel MTJ elements in each path. The number of MTJ elements in each path does not have to be the same, and the number of paths does not have to be the same as the number of MTJ elements in any particular path. For example, if a reference value of 1.5 times Rp (or in other words, 3/2 Rp) is desired, it could be obtained by building a resistance network having two paths each of which includes three parallel MTJ elements. The output between first nodes 308 and second nodes 316 in this case would be equal to 1.5 times Rp.

Figure 12:
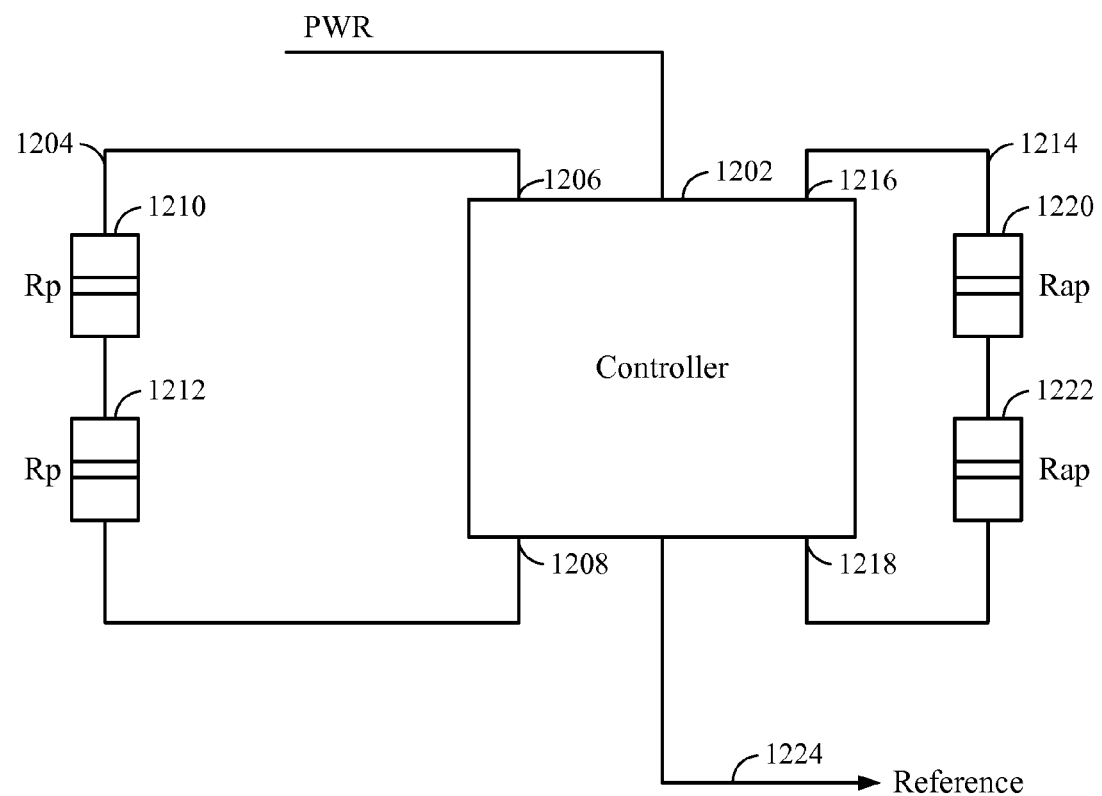
FIG. 12 is a schematic circuit diagram showing an arrangement for calculating a reference level using a controller.

FIG. 12 illustrates an arrangement for generating a reference level that includes a controller 1202 and a first path 1204 leading from a first input 1206 of the controller 1202 to a second input 1208 of the controller 1202. The first path 1204 includes a first MTJ element 1210 and a second MTJ element 1212 connected in series. A second path 1214 leads from a third input 1216 of the controller 1202 to a fourth input 1218 of the controller 1202, and the second path 1214 includes a third MTJ element 1220 and a fourth MTJ element 1222 connected in series. It is envisioned that more than two paths may be connected to the controller 1202 and that each of the two or more paths may include more than two MTJ elements. In this embodiment, the first path 1204 is not connected in parallel to the second path 1214; however, the controller 1202 determines the resistances between the first and second inputs 1206, 1208, and between the third and fourth inputs 1216 and 1218, and calculates the combined parallel resistance of the first path 1204 and the second path 1214. The resistance of the first path 1204 and the resistance of the second path 1214 may be multiplied by the same or different scale factors before the parallel resistance is calculated, and, optionally, the calculated resistance itself may be multiplied by a scale factor before being output. With or without the aforementioned scaling, the combined resistance is output to the inverting input 310 of the comparator 306 on an output line 1224 for use as a reference level for comparison with the measured resistance of the target MTJ 304.

Figure 13:
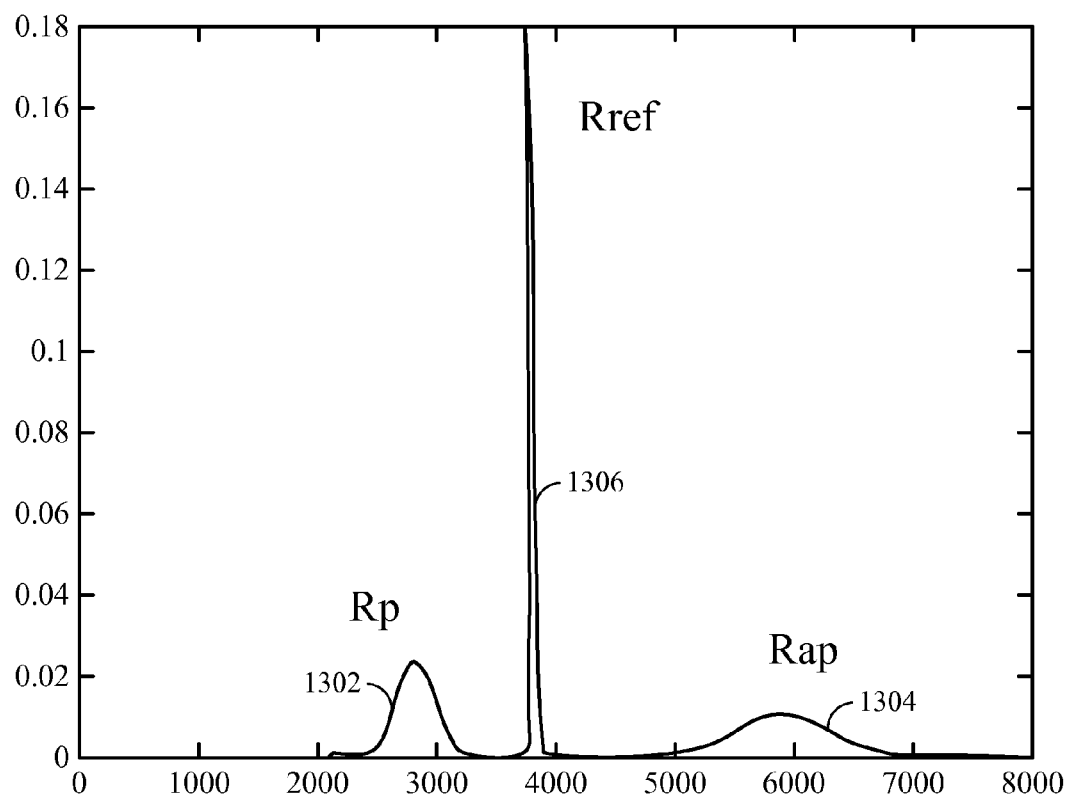
FIG. 13 is a graph showing a representative separation between a distribution of reference resistances and distributions of parallel and antiparallel resistances provided by embodiments.

FIG. 13 illustrates a first distribution 1302 of typical measured values for the parallel resistance Rp of target MTJ devices such as the target MTJ 304, a second distribution 1304 of typical measured values for the antiparallel resistance Rap for the target MTJ 304 and a third distribution 1306 showing the expected reference values that would be produced by various ones of the reference cells described above. The third distribution 1306 is representative of the distributions produced by the various reference cells and provides an example of the extent of separation between the third, reference, distribution 1306, the first distribution 1302 of Rp and the second distribution 1304 of Rap but may not be identical to the third distribution 1306 produced by any particular one of the reference cells disclosed herein. The third distribution 1306 matches fairly closely with the distribution that would be produced by the embodiment of FIG. 5 if j=m=8.

Figure 14:
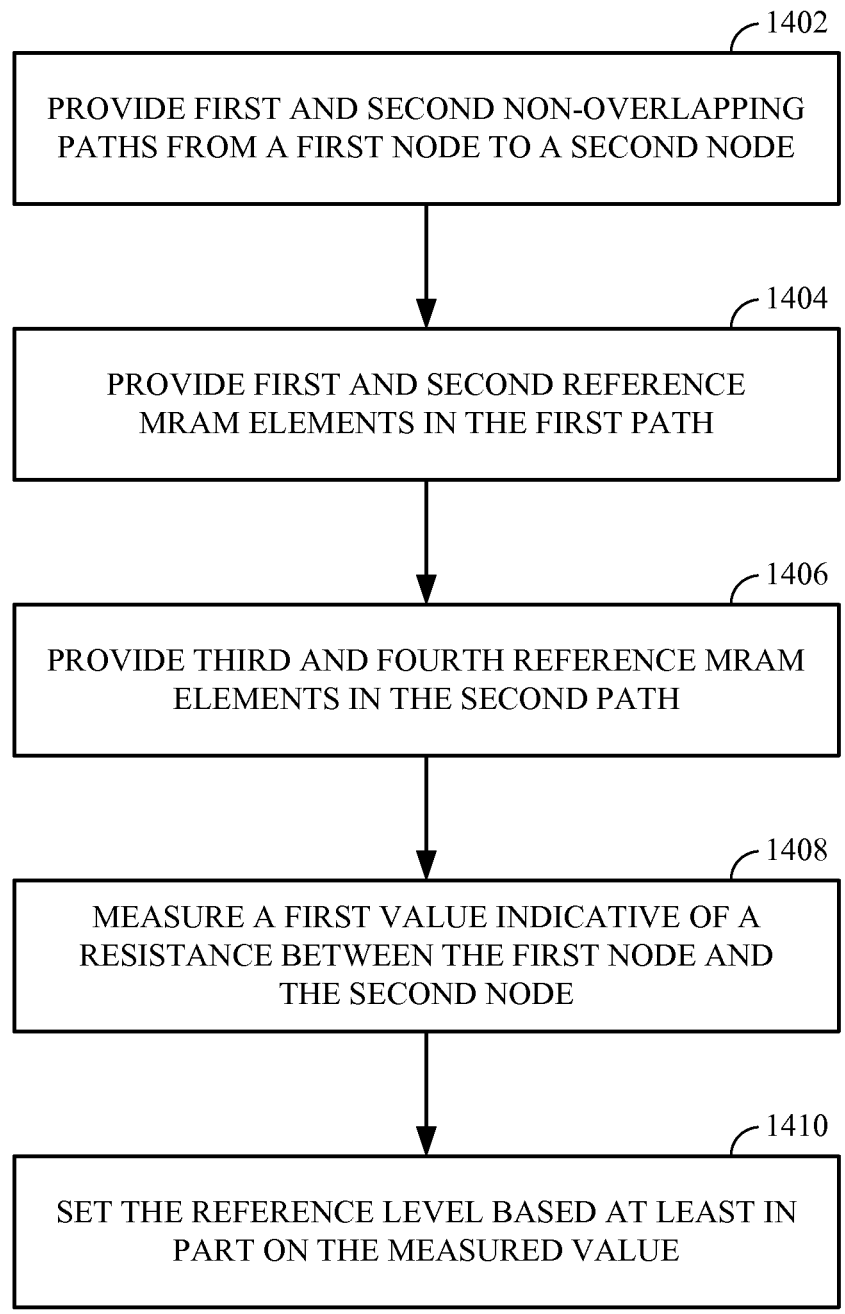
FIG. 14 is a flow chart illustrating a method according to an embodiment.

FIG. 14 illustrates a method according to an embodiment that includes a block 1402 of providing first and second non-overlapping paths from a first node to a second node, a block 1404 of providing first and second reference MRAM elements in the first path, a block 1406 of providing third and fourth reference MRAM elements in the second path, a block 1408 of measuring a first value indicative of a resistance between the first node and the second node, and a block 1410 of setting the reference level based at least in part on the measured value.

Figure 15:
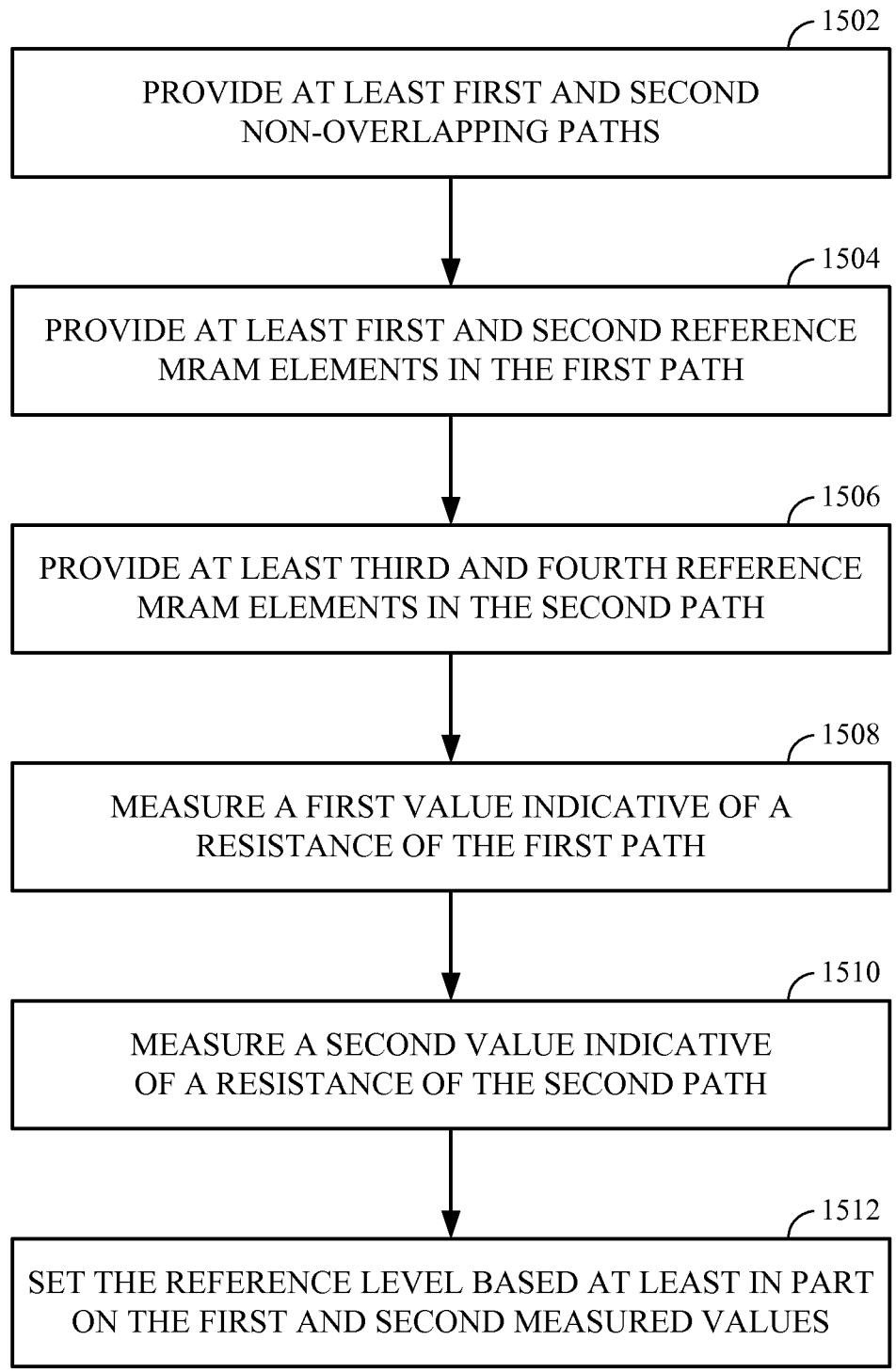
FIG. 15 is a flow chart illustrating a method according to another embodiment.

FIG. 15 illustrates another method that includes a block 1502 of providing at least first and second non-overlapping paths, a block 1504 of providing at least first and second reference MRAM elements in the first path, a block 1506 of providing at least third and fourth reference MRAM elements in the second path, a block 1508 of measuring a first value indicative of a resistance of the first path, a block 1510 of measuring a second value indicative of a resistance of the second path, and a block 1512 of setting the reference level based at least in part on the first and second measured values.

The reference cells according to the various embodiments can be integrated in at least one semiconductor die and/or may be integrated into a device such as a set top box, a music player, a video player, an entertainment unit, a navigation device, a communications device, a personal digital assistant (PDA), a fixed location data unit, and a computer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of establishing a reference level comprising:
providing first and second non-overlapping paths from a first node to a second node;
providing first and second reference magnetic random access memory (MRAM) elements in the first path;
providing third and fourth reference MRAM elements in the second path;
measuring a first value indicative of a resistance between the first node and the second node; and
setting the reference level based at least in part on the measured value,
wherein both of the first and second MRAM elements are in a parallel state or both of the first and second MRAM elements are in an antiparallel state.

2. The method of claim 1 including comparing the reference level to a measured level of a target MRAM element.

3. The method of claim 1, wherein the reference MRAM elements comprise magnetic tunnel junctions (MTJ's).

4. The method of claim 3, wherein the MTJ's comprise spin torque transfer (STT) MTJ's.

5. The method of claim 3 including:
connecting a first path intermediate node located between the first reference MRAM element in the first path and the second reference MRAM element in the first path to a second path intermediate node located between the third reference MRAM element in the second path and the fourth reference MRAM element in the second path.

6. The method of claim 3 including
providing j additional reference MRAM elements in the first path;
providing j additional reference MRAM elements in the second path;
providing m additional non-overlapping paths from the first node to the second node; and
providing j+2 reference MRAM elements in each of the m additional non-overlapping paths.

7. The method of claim 3 including
providing at least one additional reference MRAM element in the first path; and
providing at least one additional non-overlapping path from the first node to the second node, each of the at least one additional non-overlapping path including at least two reference MRAM elements.

8. The method of claim 3, wherein the first and second paths are electrically parallel.

9. The method of claim 1, wherein setting the reference level based on the measured value comprises multiplying the measured value by a constant.

10. A method of establishing a reference level comprising:
providing at least first and second non-overlapping paths;
providing at least first and second reference magnetic random access memory (MRAM) elements in the first path;
providing at least third and fourth reference MRAM elements in the second path;
measuring a first value indicative of a resistance of the first path;
measuring a second value indicative of a resistance of the second path; and
setting the reference level based at least in part on the first and second values.

11. The method of claim 10 wherein setting the reference level based at least in part on the first and second values includes multiplying at least one of the first and second values by a scale factor.

12. The method of claim 10, wherein setting the reference level comprises calculating the combined resistance of the first path resistance in parallel with the second path resistance.

13. The method of claim 12 including multiplying the combined resistance by a scale factor.

14. A reference circuit for generating a reference level, the reference circuit comprising:
first and second non-overlapping paths from a first node to a second node;
first and second reference MRAM elements in the first path;
third and fourth reference MRAM elements in the second path; and
a measurement circuit receiving a first value indicative of a resistance between the first node and the second node and outputting the reference level based at least in part on the first value,
wherein both of the first and second MRAM elements are in a parallel state or both of the first and second MRAM elements are in an antiparallel state.

15. The reference circuit of claim 14 further comprising a comparator configured to receive the reference level at a first input and a signal related to a measured resistance of a target MRAM at a second input.

16. The reference circuit of claim 14, wherein the reference MRAM elements comprise magnetic tunnel junctions (MTJ's) having a parallel state and an antiparallel state.

17. The reference circuit of claim 16, wherein the MTJ's comprise spin torque transfer (STT) MTJ's.

18. The reference circuit of claim 16 including
j additional reference MRAM elements in the first path;
j additional reference MRAM elements in the second path;
m additional non-overlapping paths from the first node to the second node; and
j+2 reference MRAM elements in each of the m additional non-overlapping paths.

19. The reference circuit of claim 16 including
at least one additional reference MRAM element in the first path; and
at least one additional non-overlapping path from the first node to the second node, each of the at least one additional non-overlapping path including at least two reference MRAM elements.

20. The reference circuit of claim 16, wherein the first and second paths are electrically parallel.

21. The reference circuit of claim 16 including:
a first path intermediate node located between the first reference MRAM element in the first path and the second reference MRAM element in the first path electrically connected to a second path intermediate node located between the third reference MRAM element in the second path and the fourth reference MRAM element in the second path.

22. The reference circuit of claim 21 including
j additional reference MRAM elements in the first path;
j additional reference MRAM elements in the second path;
m additional non-overlapping paths from the first node to the second node; and
j+2 reference MRAM elements in each of the m additional non-overlapping paths.

23. The reference circuit of claim 21 including
at least one additional reference MRAM element in the first path; and
at least one additional non-overlapping path from the first node to the second node, each of the at least one additional non-overlapping path including at least two reference MRAM elements.

24. The reference circuit of claim 14 integrated in at least one semiconductor die.

25. The reference circuit of claim 14 integrated into a device selected from the group consisting of a set top box, music player, video player, entertainment unit, navigation device, communications device, personal digital assistant (PDA), fixed location data unit, and a computer.

26. A reference circuit for generating a reference level, the reference circuit comprising:
at least first and second non-overlapping paths;
at least first and second reference magnetic random access memory (MRAM) elements in the first path;
at least third and fourth reference MRAM elements in the second path; and
a controller for measuring a first value indicative of a resistance of the first path and for measuring a second value indicative of a resistance of the second path and for setting the reference level based at least in part on the first and second values.

27. The method of claim 26 wherein the controller is configured to multiply at least one of the first and second values by a scale factor.

28. The method of claim 26, wherein the controller is configured to calculate a combined resistance of the first path resistance in parallel with the second path resistance.

29. The method of claim 28 wherein the controller is configured to multiply the combined resistance by a scale factor.

30. A reference circuit for generating a reference level, the reference circuit comprising:
first and second path means for connecting a first node and a second node;
first and second reference MRAM elements in the first path means, the first and second MRAM elements both being in a parallel magnetic state or both being in an antiparallel magnetic state;
third and fourth reference MRAM elements in the second path means; and
determining means for receiving a first value indicative of a resistance between the first node and the second node and outputting the reference level based at least in part on the first value.

31. The reference circuit of claim 30, further including comparison means for comparing the reference level to a signal related to a measured resistance of a target MRAM.

32. A reference circuit for generating a reference level, the reference circuit comprising:
at least first and second non-overlapping path means for connecting a first node and a second node;
at least first and second reference magnetic random access memory (MRAM) elements in the first path means;
at least third and fourth reference MRAM elements in the second path means;
control means for measuring a first value indicative of a resistance of the first path means and for measuring a second value indicative of a resistance of the second path means and for setting the reference level based at least in part on the first and second measured values.

33. A method of establishing a reference level comprising:
steps for providing first and second non-overlapping paths from a first node to a second node;
steps for providing first and second reference magnetic random access memory (MRAM) elements in the first path, the first and second MRAM elements both being in a parallel magnetic state or both being in an antiparallel magnetic state;
steps for providing third and fourth reference MRAM elements in the second path;
steps for measuring a first value indicative of a resistance between the first node and the second node; and
steps for setting the reference level based at least in part on the measured value.

34. The method of claim 33 including steps for comparing the reference level to a measured level of a target MRAM element.

35. The method of claim 33 including:
steps for connecting a first path intermediate node located between the first reference MRAM element in the first path and the second reference MRAM element in the first path to a second path intermediate node located between the third reference MRAM element in the second path and the fourth reference MRAM element in the second path.

36. The method of claim 33 including
steps for providing j additional reference MRAM elements in the first path;
steps for providing j additional reference MRAM elements in the second path;
steps for providing m additional non-overlapping paths from the first node to the second node; and
steps for providing j+2 reference MRAM elements in each of the m additional non-overlapping paths.

37. The method of claim 33 including
steps for providing at least one additional reference MRAM element in the first path; and
steps for providing at least one additional non-overlapping path from the first node to the second node, each of the at least one additional non-overlapping path including at least two MRAM elements.

38. A method of establishing a reference level comprising:
steps for providing at least first and second non-overlapping paths;
steps for providing at least first and second reference magnetic random access memory (MRAM) elements in the first path;
steps for providing at least third and fourth reference MRAM elements in the second path;
steps for measuring a first value indicative of a resistance of the first path;
steps for measuring a second value indicative of a resistance of the second path; and
steps for setting the reference level based at least in part on the first and second measured values.

39. The method of claim 38, wherein the steps for setting the reference level comprise steps for calculating the combined resistance of the first path resistance in parallel with the second path resistance.

40. A reference circuit for generating a reference level, the reference circuit comprising:
first and second non-overlapping paths from a first node to a second node;
first and second reference MRAM elements in the first path;
third and fourth reference MRAM elements in the second path;
a first path intermediate node located between the first reference MRAM element in the first path and the second reference MRAM element in the first path electrically connected to a second path intermediate node located between the third reference MRAM element in the second path and the fourth reference MRAM element in the second path; and
a measurement circuit receiving a first value indicative of a resistance between the first node and the second node and outputting the reference level based at least in part on the first value.

41. The reference circuit of claim 40 including
at least one additional reference MRAM element in the first path; and
at least one additional non-overlapping path from the first node to the second node, each of the at least one additional non-overlapping path including at least two reference MRAM elements.

* * * * *